United States Patent [19]

Ishibashi et al.

[11] Patent Number: 5,019,890
[45] Date of Patent: May 28, 1991

[54] HETEROJUNCTION BIPOLAR TRANSISTOR

[75] Inventors: Tadao Ishibashi; Yoshiki Yamauchi, both of Tokyo, Japan

[73] Assignee: Nippon Telegraph and Telephone Corporation, Tokyo, Japan

[21] Appl. No.: 587,451

[22] Filed: Sep. 14, 1990

Related U.S. Application Data

[63] Continuation of Ser. No. 152,899, Feb. 5, 1988, abandoned.

[30] Foreign Application Priority Data

Feb. 6, 1987 [JP] Japan .................................. 62-24761
May 25, 1987 [JP] Japan .................................. 62-125748

[51] Int. Cl.$^5$ .................. H01L 29/72; H01L 29/161; H01L 29/205
[52] U.S. Cl. ......................................... 357/34; 357/16
[58] Field of Search ................. 357/16, 34, 34 HB, 35

[56] References Cited

U.S. PATENT DOCUMENTS 4,672,413  6/1987  Gardner ................................. 357/34

FOREIGN PATENT DOCUMENTS 62-12164  1/1987  Japan ........................... 357/34 HB
62-33461  2/1987  Japan ........................... 357/34 HB

OTHER PUBLICATIONS

"A Proposed Structure for Collector Transit-Time Reduction in AlGaAs/GaAs Bipolar Transistors" by C. M. Maziar et al. (IEEE, Electron Dev. Lett. EDL-7, No. 8, pp. 483-485, 1986).

Primary Examiner—Jerome Jackson, Jr.
Assistant Examiner—Ngan Van Ngo
Attorney, Agent, or Firm—Blakely, Sokoloff, Taylor & Zafman

[57] ABSTRACT

A heterojunction bipolar transistor includes an emitter layer of a first conductivity type, a base layer of a second conductivity type adjacent to the emitter layer, a collector buffer layer of the first conductivity type, and a collector layer arranged between the collector buffer layer and the base layer. The collector layer includes a first collector layer formed at the side of the base layer and a second collector layer arranged at the side of the collector buffer layer. The first collector layer is a semiconductor layer having an impurity concentration lower than that of the base layer. The second collector layer is a semiconductor layer of the second conductivity type having an impurity concentration higher than that of the first collector layer.

7 Claims, 5 Drawing Sheets

HETEROJUNCTION BIPOLAR TRANSISTOR

This is a continuation of application Ser. No. 152,899, filed Feb. 5, 1988, now abandoned.

BACKGROUND OF THE INVENTION

The present invention relates to a bipolar transistor which can operate at a high operating frequency and with a high speed, more particularly, to a heterojunction bipolar transistor.

In a conventional transistor of this type, e.g., in an n-p-n heterojunction bipolar transistor, a semiconductor layer (collector layer) for forming a base-collector depletion layer consists of an n-type layer having a concentration lower than concentrations of a base layer, where the n-type collector layer has a uniform or an inclined concentration distribution. A heterojunction bipolar transistor (to be referred to as an "HBT" hereinafter) using a III-V Group semiconductor (e.g., GaAs) which has been widely developed in recent years has a similar impurity structure.

In this conventional structure, an electrical field intensity in the base-collector depletion layer which is mostly determined by an impurity concentration of the collector layer is significantly high. If, for example, the impurity concentration is $5 \times 10^{16}/cm^3$, the electric field intensity of the base-collector depletion layer is increased more than 100 kV/cm when an appropriate bias voltage is applied to terminals of transistor for transistor operation. Therefore, under such a high electric field, an electron velocity in the depletion layer is determined as an "electron saturation velocity (Vs)" as is well known, and a corresponding collector transit time $t_C$ is given as follows:

$$t_C = W_C/2V_s$$

where $W_C$ is a base-collector depletion layer width.

In an Si bipolar transistor, since a ratio of a base transit time $t_B$ to a total delay time of an element is large and the collector transit time $t_C$ has minor contribution, almost no problem is posed. However, since the base transit time $t_B$ is very short in an AlGaAs/GaAs HBT or the like, contribution of the collector transit time $t_C$ poses a great concern.

Figure 1A:
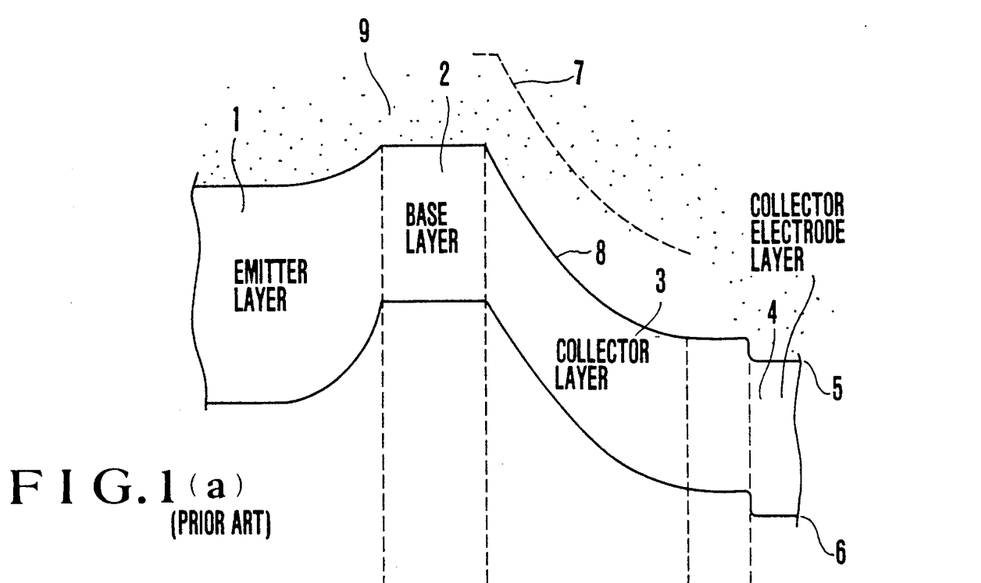
FIGS. 1(a) to 1(c) are views for explaining an operation of a conventional heterojunction bipolar transistor.
Figures 1B, 1C:
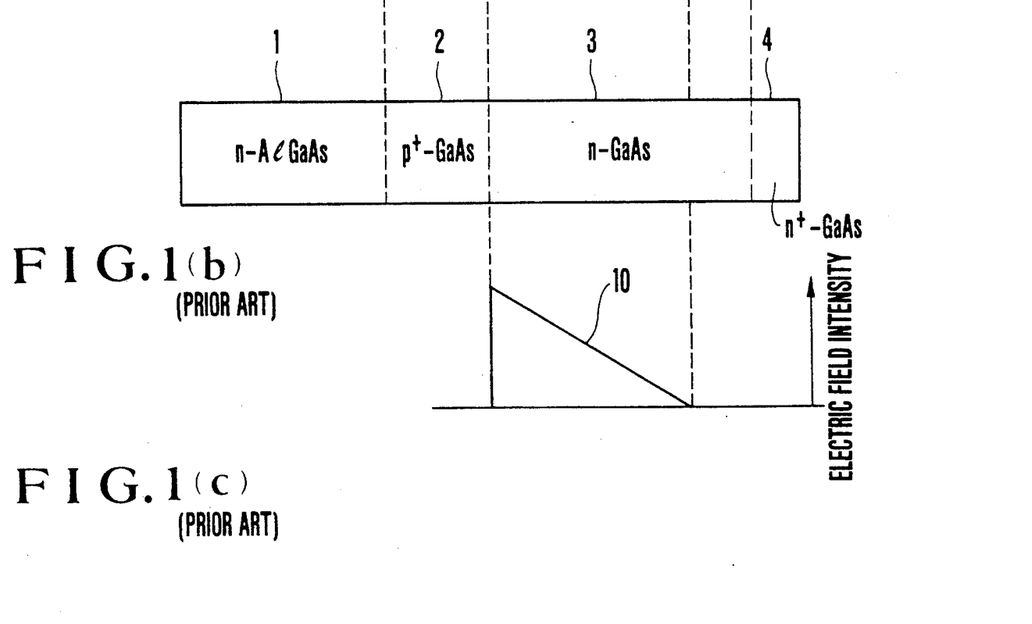

Transport of electrons in a collector in a conventional AlGaAs/GaAs HBT will be described with reference to FIGS. 1(a) to 1(c). FIG. 1(a) shows an energy band diagram, FIG. 1(b) shows a layer arrangement, and FIG. 1(c) shows an electric field distribution in a collector depletion layer In FIGS. 1(a) and 1(b), reference numeral 1 denotes an emitter layer; 2, a base layer; 3, a collector layer; 4, a collector electrode layer; 5, a conduction band edge; 6 a valence band edge; 7, an energy band edge curve representing the bottom of an L valley; 8, an energy curve representing the bottom of a Γ valley in this case, equal to 5; and 9, electrons. In a normal state wherein a base/collector junction forms a $p^+$-n diode, an electric field intensity is maximized just inside of the collector layer on a junction plane as indicated by an electric field intensity profile line 10 in FIG. 1(c). Therefore, since an energy of the electrons 9 injected from a base into the collector is increased higher before they run several hundreds Å, the electrons 9 enter into and are distributed not only in a Γ valley but also in the L and X valleys having high energies. This is inherent because, as long as a base/collector bias voltage is plotted on the reverse biasing side with respect to about +0.5 V, i.e., it falls within an active region of the transistor, electron energy exceeds easily an energy between the L valley and a lower Γ valley is about 0.3 eV in GaAs.

When the electrons 9 move to the L or X valley, an electron velocity becomes a so-called saturation velocity Vs. When GaAs is used, the saturation velocity Vs is around $7 \times 10^6$ cm/sec. Since an effective mass of the electrons entering into the L or X valley becomes larger than that of the electrons distributed in the Γ valley, the electron velocity in these valleys becomes smaller than that obtained in the Γ valley.

Recently, "A Proposed Structure for Collector Transit-Time Reduction in AlGaAs/GaAs Bipolar Transistors" by C. M. Maziar et al. (IEEE, Electron Dev. Lett. EDL-7, No. 8, pp. 483–485, 1986) describes a proposal of reducing an electric field intensity in the collector depletion layer on the base side and increasing an electron velocity. That is, by changing a conductivity type of a collector layer from a conventional n-type to a p-type, the peak of an electric field is shifted to the side of a collector electrode layer.

However, a degree of such an improvement is only several tens% in terms of a collector transit time. This is because, although an overshoot effect (i.e., a phenomenon in which an electron velocity is transitionally increased) is partially utilized, this effect is not significant as a whole since the electrons 9 transits a region of 50% or more of a base-collector depletion layer at a saturation velocity.

SUMMARY OF THE INVENTION

It is, therefore, a principal object of the present invention to provide an HBT which can operate with a high speed by increasing a current gain cutoff frequency.

It is another object of the present invention to provide an HBT in which a collector breakdown voltage is increased higher by reducing an ionization rate or a tunnel probability.

In order to achieve the above first object of the present invention, the present invention provides a novel structure of a base-collector depletion layer for preventing saturation of a velocity of electrons and is entirely different from a conventional method of designing on the basis of a single collector layer impurity concentration. More specifically, according to the present invention, a structure for positively utilizing velocity overshoot of electrons is formed by an impurity concentration.

According to an aspect of the present invention, there is provided a heterojunction bipolar transistor comprising an emitter layer of a first conductivity type, a base layer of a second conductivity type adjacent to the emitter layer, a collector buffer layer of the first conductivity type, and a collector layer arranged between the collector buffer layer and the base layer, wherein the collector layer includes a first collector layer formed at the side of the base layer and a second collector layer arranged at the side of the collector buffer layer, the first collector layer is a semiconductor layer having an impurity concentration lower than that of the base layer, and the second collector layer is a semiconductor layer of the second conductivity type having an impurity concentration higher than that of the first collector layer.

According to another aspect of the present invention, there is provided a heterojunction bipolar transistor comprising an emitter layer of a first conductivity type, a base layer of a second conductivity type adjacent to the emitter layer, a collector buffer layer of the first conductivity type, and a collector layer arranged between the collector buffer layer and the base layer, wherein the collector layer includes a first collector layer formed at the side of the base layer and a second collector layer arranged at the side of the collector buffer layer, the first collector layer is formed to have an impurity concentration lower than that of the collector buffer layer, a band gap energy of which is formed in a predetermined distribution from the base layer to the collector buffer layer, the second collector layer is formed to have an impurity concentration of the second conductivity type higher than that of the first collector layer, a band gap energy of which is incremented from the first collector layer to the collector buffer layer, and the collector buffer layer has a band gap energy larger than that of the first collector layer.

BRIEF DESCRIPTION OF THE DRAWINGS

FIGS. 2(a) to 2(c) are views for explaining an operation of an embodiment of an HBT according to the present invention;

DESCRIPTION OF THE PREFERRED EMBODIMENTS

Figure 2A:
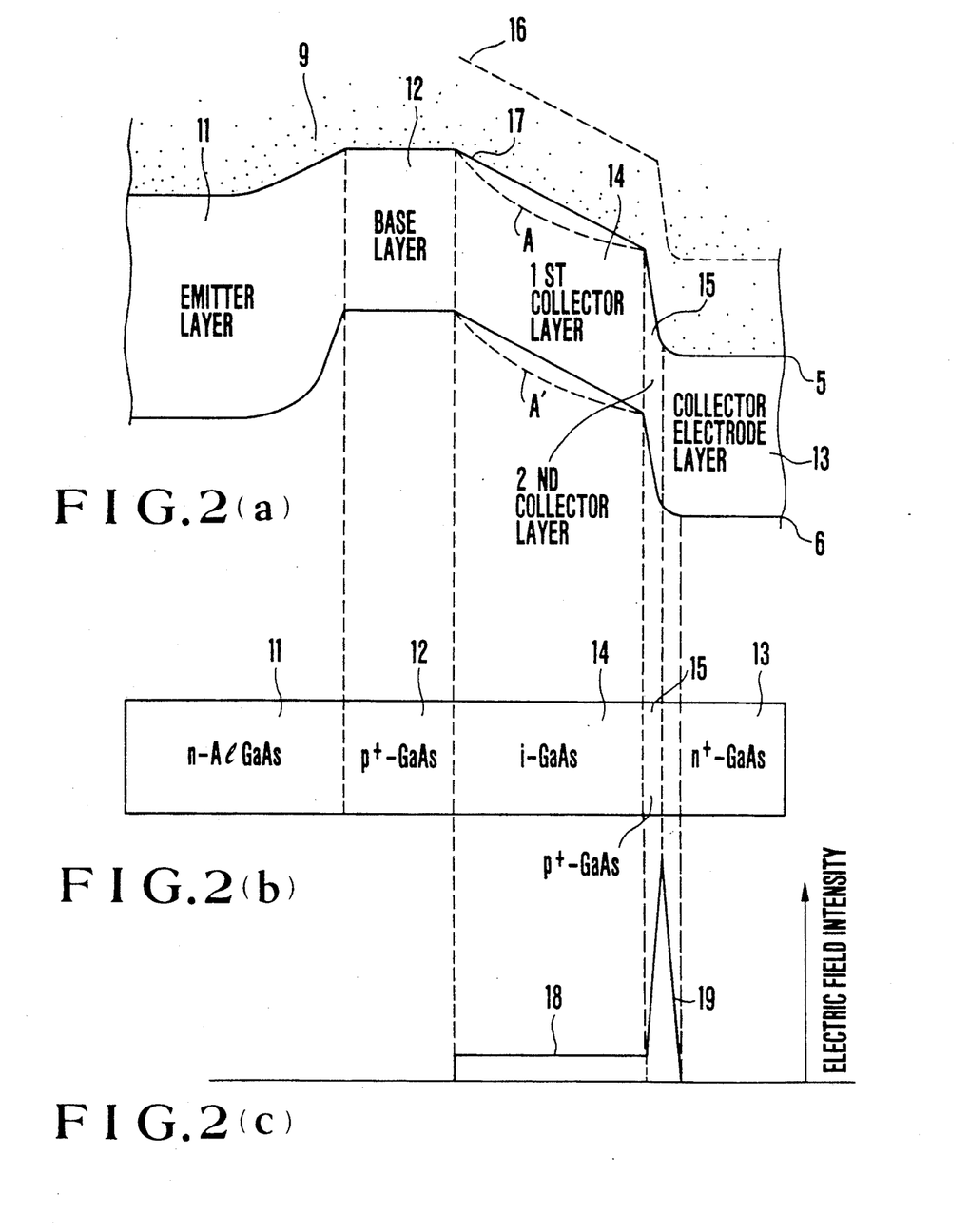

FIGS. 2(a) to 2(c) show an embodiment of an HBT according to the present invention, in which FIG. 2(a) shows an energy band diagram of an n-p-n AlGaAs/GaAs HBT, FIG. 2(b) shows a layer structure, and FIG. 2(c) shows an electric field distribution in a collector depletion layer. In FIGS. 2(a) to 2(c), reference numeral 11 denotes an emitter layer consisting of AlGaAs containing a first conductivity type (n-type) impurity such as silicon; 12, a base layer consisting of GaAs containing a second conductivity type (p-type) impurity such as beryllium and having a high concentration; 13, a collector electrode layer consisting of n-type (e.g., silicon) GaAs having a high concentration; 14, a first collector layer consisting of a i-GaAs of a semiconductor insulating semiconductor; 15, a second collector layer as a semiconductor layer consisting of GaAs containing a second conductivity type (p+-type) impurity such as beryllium and having an impurity concentration higher than that of the collector layer 14; 16, an energy band edge curve representing the bottom of an L valley; 17, an energy band edge curve representing the bottom of a Γ valley in this case, equal to 16; and 18 and 19, curves representing an electric field intensity in a collector depletion layer obtained when a bias voltage is supplied. When both the first and second collector layers 14 and 15 are depleted, a substantially constant electric field intensity is distributed in the first collector layer 14, and an electric field having an steep peak is distributed in a depletion layer portion consisting of the second collector 15 and part of the collector electrode layer 13. Note that the same parts as in FIGS. 1(a) to 1(c) are denoted by the same reference numerals in FIGS. 2(a) to 2(c). In FIGS. 2(a) to 2(c), although the first collector layer 14 consists of i-GaAs, it may be a GaAs layer consisting of the first or second conductivity type having an impurity concentration lower than that of the base layer 12.

A bias condition for operating the transistor having the above structure is the same as that for operating a conventional transistor, i.e., an emitter-base junction is forward-biased, and a base-collector junction is reverse-biased below about 0.5 V.

In the case of conventional HBT, electrons injected in a base-collector depletion layer are accelerated under a high electric field as described before. Therefore, in the conventional transistor, an energy of the electrons is increased, and the electrons are distributed in the L or X valley having a high energy.

On the contrary, in this embodiment, a potential drop in the base-collector depletion layer is divided into two regions represented by the characteristic curves 18 and 19 shown in FIG. 2(c). In order to reduce the potential drop in i-GaAs of the collector layer 14, p+-GaAs is inserted as the second collector layer 15. In addition, a concentration of the collector layer 15 is increased to obtain a thin layer having a thickness of 100 to 200 Å or less, so that the thickness of the collector layer 14 occupies most of the entire base-collector depletion layer.

If the steep potential drop consisting of the collector layer 15 and a part of collector electrode layer is adjusted to 1.4 V or less, a problem of a leak current is not posed. This is because no tunnel current appears. A difference between structures of the conventional transistor and that according to the present invention is apparent by comparing the electric field distributions shown in FIGS. 2(c) and 1(c). When the potential drop in the collector layer 14 is about 0.3 V or less, the electrons are rarely distributed in the L valley as shown in FIG. 2(a). Assuming that mobility of the electrons is $\mu = 4,000$ cm$^2$/V sec and an electric field intensity in the collector layer 14 is 20 kV/cm, and a non-parabolic property of the conduction band is neglected for simplicity, an electron velocity Vd reaches to a value given as follows:

$$Vd = \mu E = 8 \times 10^7 \text{ cm/sec}$$

That is, the electron velocity is increased about ten times that in the conventional transistor. Layer thicknesses and impurity concentrations of the collector layers 14 and 15 can be designed in accordance with an application purpose. For example, when the potential drop in the collector layer 14 is about 2ΔE/q assuming that an energy difference between the Γ and L valleys is ΔE, a sufficient effect can be expected, resulting in a wide range of design flexibility. It is a matter of course that a collector transit time is maximally reduced to about 1/10 that of the conventional transistor.

Figure 5:
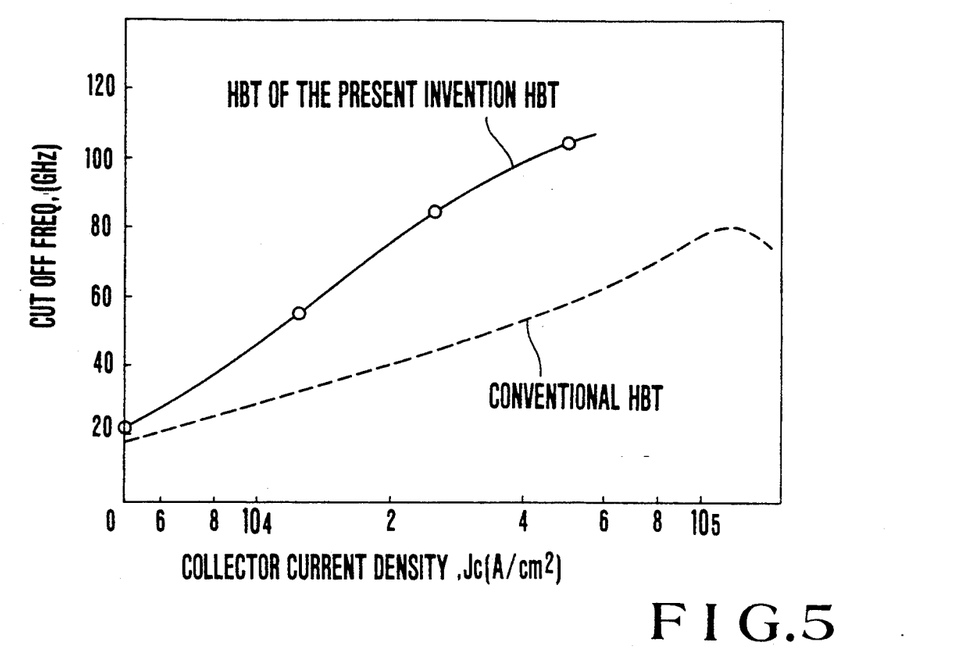
FIG. 5 is a graph showing a collector current density-cutoff frequency characteristic of a transistor manufactured in accordance with the present invention.

FIG. 5 is a graph for explaining characteristics of a transistor manufactured in accordance with the present invention, in which the ordinate represents a cutoff frequency $f_T$ and the abscissa represents a collector current density $J_C$. In FIG. 5, a solid line represents transistor characteristics according to the present invention, and a broken line represents conventional HBT characteristics. A collector structure of the transistor of the present invention is the same as that shown in FIGS. 2(a) and 2(b), the thickness of the i-GaAs layer of the first collector layer 14 is 2,000 Å, and that of the p+-GaAs of the second collector layer 15 is 200 Å (concentration; $2 \times 10^{18}$ cm$^3$).

A difference between the characteristics of the two transistors is small in a region where $J_C$ is $10^4$ A/cm$^2$ or less. However, in a region where $J_C > 10^4$ A/cm$^2$ or more where the collector transit time affects the cutoff frequency $f_T$, the transistor according to the present invention has a value higher by 20 to 40 GHz than that of the conventional HBT and hence is apparently effective more than the conventional HBT.

Giving an initial velocity to the electrons injected into the base-collector depletion layer is more effective. For this purpose, an n-layer 23 shown in FIGS. 3(a) and 3(b) may be formed, or a combination with a graded band gap base 32 shown in FIGS. 4(a) and 4(b) may be made.

Figures 3A, 3B:
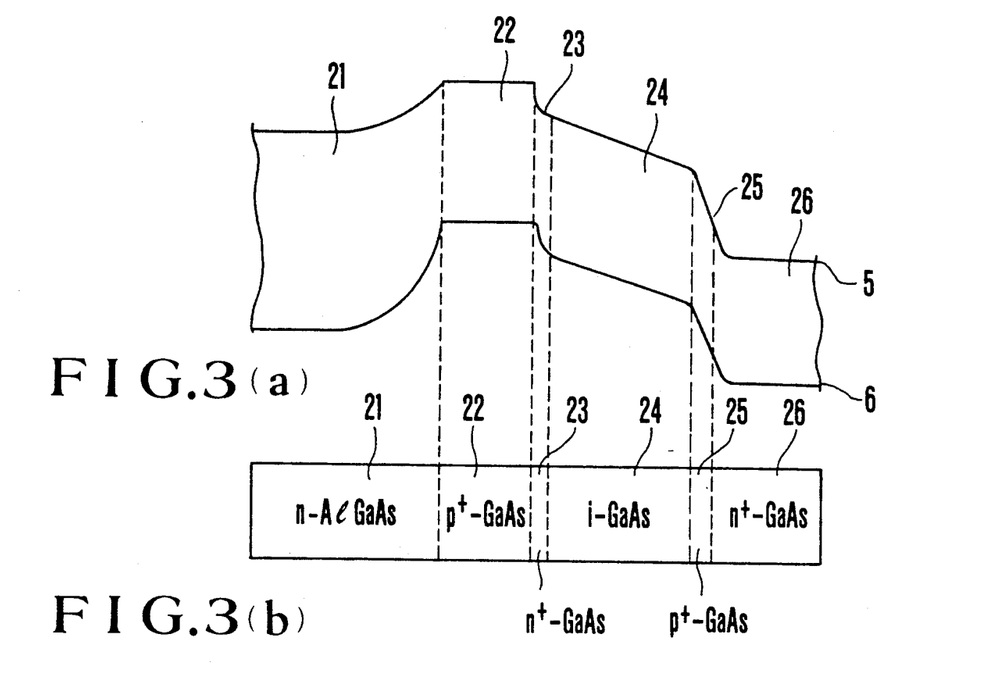
FIGS. 3(a) and 3(b) are views for explaining another embodiment of the present invention.

In FIGS. 3(a) and 3(b), reference numeral 21 denotes an emitter layer consisting of n-AlGaAs containing an n-type impurity such as silicon; 22, a base layer consisting of p+-GaAs having a high concentration of a p-type impurity such as beryllium; 23, a third collector layer consisting of n-GaAs containing an n-type impurity such as silicon; 24, a first collector layer consisting of semi-insulating GaAs: 25, a second collector layer consisting of p+-GaAs having a high concentration of a p-type impurity such as beryllium; and 26, a collector electrode layer consisting of n+-GaAs having a high concentration of an n-type impurity such as silicon. In this embodiment, the collector layer 24 consists of semi-insulating GaAs. However, the collector layer 24 consisting of lightly doped n−- or lightly doped p−-GaAs having an impurity concentration lower than that of the base layer 22 may be used to obtain the same effect.

Figures 4A, 4B:
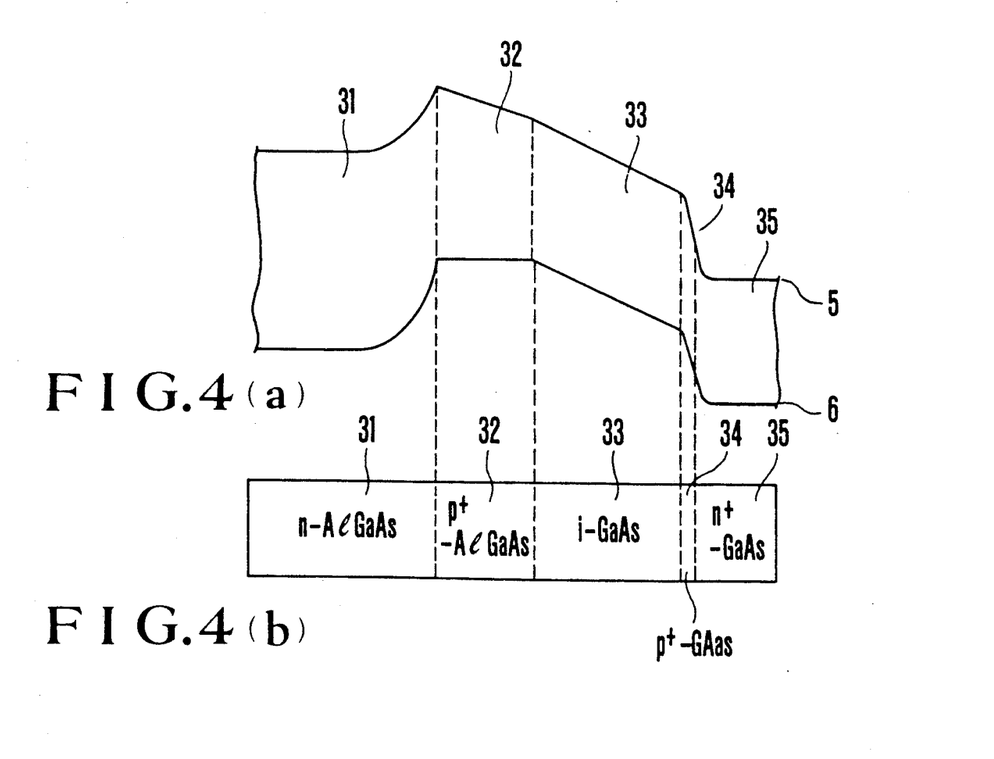
FIGS. 4(a) and 4(b) are views for explaining still another embodiment of the present invention.

In FIGS. 4(a) and 4(b), reference numeral 31 denotes an emitter layer consisting of n-AlGaAs containing an n-type impurity such as silicon; 32, a graded band gap base layer consisting of p-AlGaAs containing a p-type impurity such as beryllium; 33, a first collector layer consisting of semi-insulating GaAs; 34, a second collector layer consisting of p+-GaAs having a high concentration of a p-type impurity such as beryllium; 35, a collector electrode layer consisting of n+-GaAs having a high concentration of an n-type impurity such as silicon. In this embodiment, the collector layer 33 consists of semi-insulating GaAs. However, the collector layer 33 consisting of lightly doped n−- or lightly doped p−-GaAs having a impurity concentration lower than that of the base layer 32 may be used to obtain the same effect.

Since the electrons injected upon operation of the transistor serve as a space charge, a potential distribution of the depletion layer changes. In this embodiment, an electric field distribution in the first collector layer is changed by an injected negative charge such that a lower electric field is obtained on the side of the base layer and a higher electric field is obtained on the side of the collector electrode layer. In order to compensate for a change in electric field, an impurity distribution that provides a potential variation indicated by broken lines A and A' when electrons are not injected in the first collector layer in FIG. 2(a) may be formed by doping silicon, resulting in that predetermined electric field distribution may be formed when electrons are injected.

As described above, according to the present invention, the first and second collector layers are provided as a collector layer, the first collector layer serves as a semiconductor layer of a first conductive type having an impurity concentration lower than the base layer, and the second collector layer serves as a semiconductor layer of a second conductivity type having an impurity concentration higher than the first collector layer. As a result, by depleting the first and second collector layers in an operation state, the number of electrons in the valley can be increased and that of the L valley can be reduced, so that the collector transit time of the electrons and hence a transit time of the entire element can be largely reduced. For this reason, a current gain cutoff frequency of a semiconductor device can be increased, thereby improving a switching speed of a digital circuit or a power gain of a microwave transistor. Therefore, when a high-performance transistor manufactured in accordance with the present invention is used, a processing speed of a computer can be increased, a bit rate of high-speed PCM transmission can be increased, performance of radio equipment of a quasi-millimeter wave band or more can be improved, or the like.

In addition, first, second, and third collector layers may be provided as a collector layer so that the first layer serves as a semiconductor layer of a first conductivity type having an impurity concentration lower than that of a base layer, the second collector layer serves as a semiconductor layer of a second conductivity type having an impurity concentration higher than that of the first collector layer, and the third collector layer serves as a semiconductor layer of a first conductivity type having an impurity concentration higher than that of the first collector layer, and then the first to third collector layers are depleted in an operation state. In this case, the same effect as described above can be obtained.

Figure 6A:
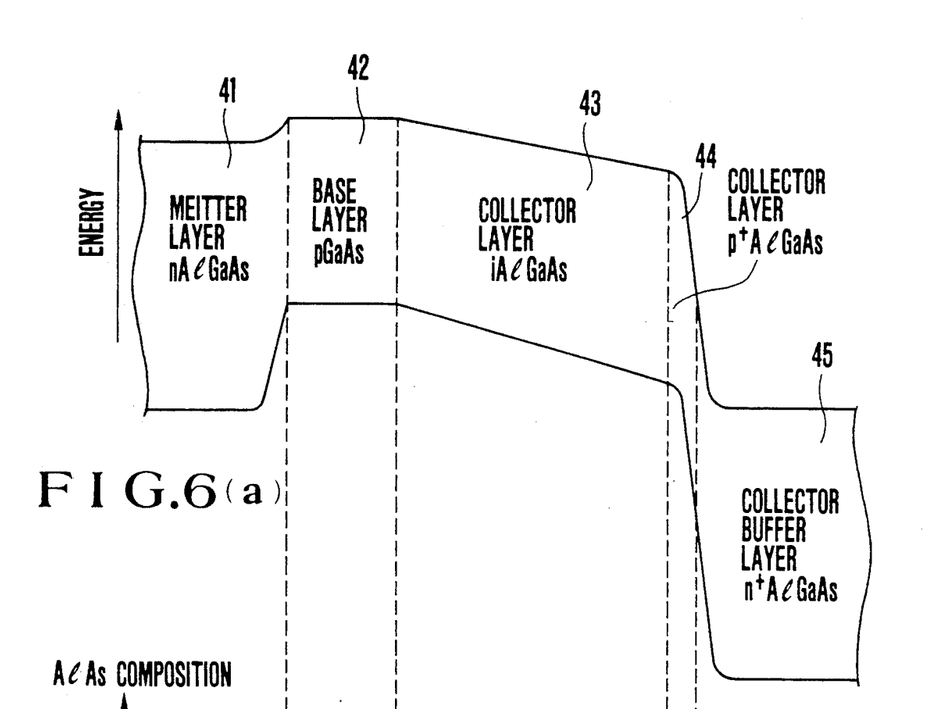
FIGS. 6(a) and 6(b) are views showing a still another embodiment of the present invention.
Figure 6B:
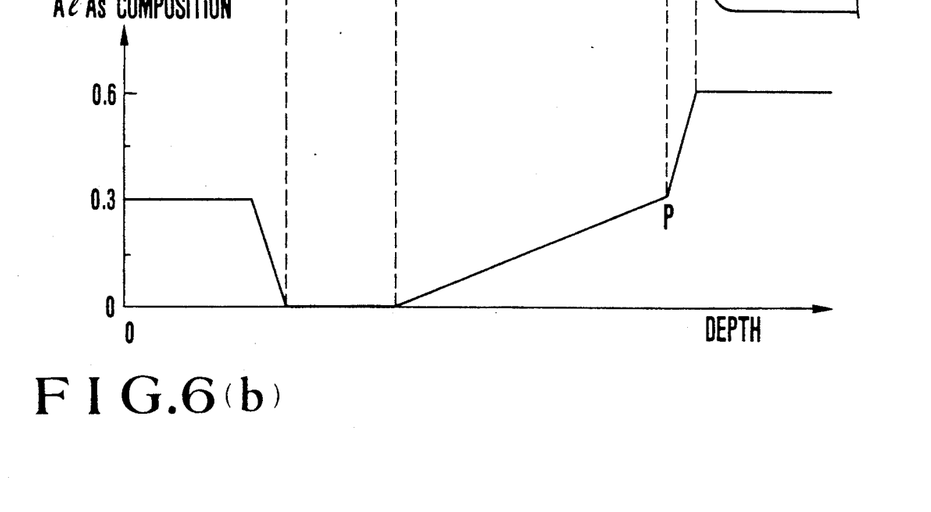

FIG. 6 shows still another embodiment of the present invention. In the embodiment shown in FIGS. 2(a) to 2(c), since the p+-n+ junction portion consisting of the second collector layer 15 and part of the collector electrode layer is formed to have a high impurity concentration, a collector breakdown voltage is relatively low. The embodiment of FIG. 6 improves this. That is, this embodiment is characterized in that a band gap energy of the p+-n+ junction is increased to increase the breakdown voltage of the portion. In the above embodiments (FIGS. 2(a) to (c)), each of the i- and p+-layer is formed of a uniform composition (e.g., GaAs), i.e., the above embodiment does not include an idea of changing a composition to change the band gap energy so as to improve the element characteristics.

Figure 7:
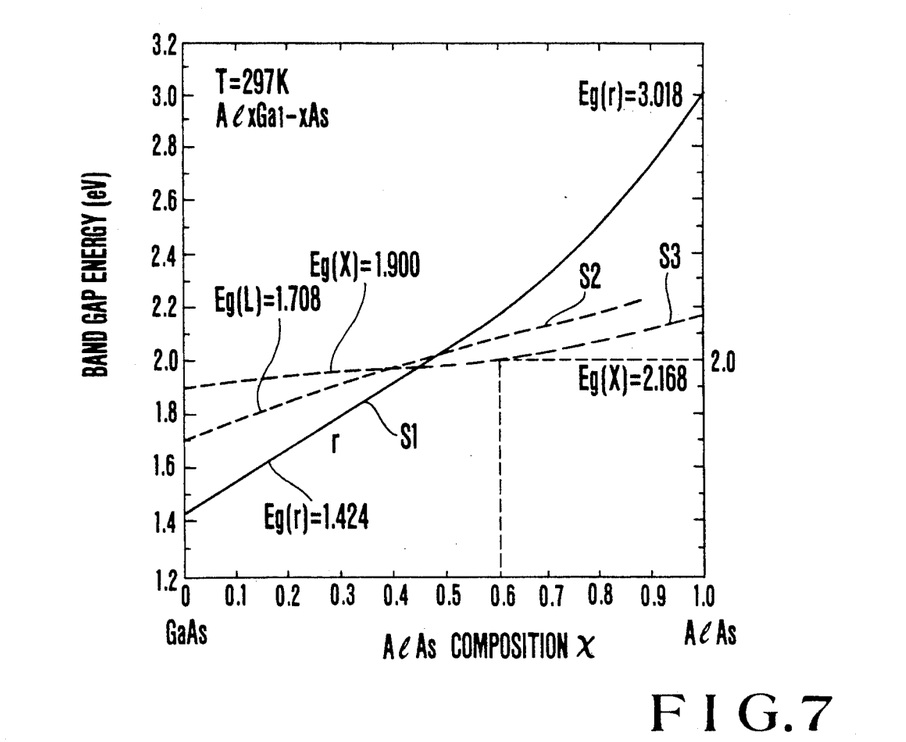
FIG. 7 is a graph showing a band gap energy as a function of an AlAs composition x.

FIG. 7 shows AlAs composition dependency of a band end energy (band gap energy) measured from the side of valence bands of Γ, L, and X valleys in a conduction band of Al$_x$Ga$_{1-x}$As of a most typical example. When x=0, a minimum band gap energy Eg (Γ) of GaAs=1.424 eV. However, when x=0.6, a minimum band gap energy Eg(X)=2.0 eV, i.e., the band gap energy is increased about 1.4 times and the ionization rate or the tunnel probability under a given voltage is largely reduced. In FIG. 7, reference symbol S1 denotes a characteristic curve representing a band gap energy of the Γ valley; S2, a characteristic curve representing that of the L valley; and S3, a characteristic curve representing that of the X valley. Note that the graph shown in FIG. 7 is described in "Heterostructure Lasers, H. C.

Casey, Jr. and M. B. Panish, ACADEMIC PRESS, 1978".

FIG. 6(a) shows a band diagram of an HBT, and FIG. 6(b) shows an AlAs composition (a value of x in $Al_xGa_{1-x}As$) with respect to a depth from an emitter layer surface. In FIGS. 6(a) and 6(b), reference numeral 41 denotes an n-$Al_xGa_{1-x}As$ emitter layer containing an n-type impurity such as silicon; 42, a p-GaAs base layer containing a p-type impurity such as beryllium; 43, a first collector layer consisting of i-AlGaAs in which an AlAs composition is changed; 44, a second collector layer consisting of p+-AlGaAs having a high concentration of a p-type impurity such as beryllium in which an AlAs composition is changed; and 45, a collector buffer layer consisting of n+-$Al_{0.6}Ga_{0.4}As$ having a high concentration of an n-type impurity such as silicon.

In order to operate this HBT, a predetermined bias voltage is applied to the emitter, base, and collector buffer layers through electrodes ohmic-contacting the respective layers, so that a collector current is supplied as in a normal case. In this embodiment, as shown in FIG. 6(b), the AlAs composition of the first collector layer 43 is linearly increased from the base layer 42 to a point P of the second collector layer 44 so that x=0 to 0.30. The AlAs composition of the second collector layer 44 is continuously increased from the point P which is an interface between the first and second collector layers 43 and 44 to the collector buffer layer 45 so that x=0.30 to 0.6. Although the first collector layer 43 may be GaAs, i.e., a composition may be constant as x=0, the AlAs composition preferably falls within the range of a direct-type band gap, i.e., within the range wherein $x \approx 0.45$ as is apparent from FIG. 7. This is because in an indirect-type band gap, mobility of electrons is reduced, thereby reducing an electron velocity at the side of a low collector bias. A major point of the present invention is a collector breakdown voltage.

This collector breakdown voltage is determined by avalanche breakdown and/or by a tunnel injection current flow depending in a potential difference or electric field intensity of a p+-n+ region, i.e., a junction portion consisting of the second collector layer 44 and part of the collector buffer layer 45. When a maximum electric field portion in the p+-n+ junction (space charge layer) of the second collector layer 44 and the collector buffer layer 45 has AlAs composition x=0.6, the band gap energy of this portion is obtained such that Eg(X)=2.0 eV (FIG. 7). Therefore, the ionization rate or the tunnel probability is reduced and the breakdown voltage is increased as compared with Eg(Γ)=1.424 eV obtained in the embodiment of FIGS. 2(a) to 2(c) wherein GaAs and the p+-n+ junction. Since the avalanche breakdown voltage is experimentally proportional to the band gap energy, an increase of 1.4 times in breakdown voltage can be expected because Eg(X)/Eg(Γ)=2.0/1.424≈1.4. When an impurity concentration of the p+-n+ junction is high, the tunnel current becomes dominant. Therefore, if the indirect-type band gap is present, the tunnel current is greatly reduced.

In the above embodiments, an HBT using a material of AlGaAs has been described. However, a material of, e.g., InGaASP, InAlGaAs, or InAlGaP may be used to obtain the same effect.

In addition the first collector layer 43 of an i-type in the above embodiments may be of a p- or n-type.

As has been described above, according to the embodiment shown in FIGS. 6(a) and 6(b), the band gap energy of the first collector layer is maintained constant or linearly increased from the base layer to the collector buffer layer, the impurity concentration of the second collector layer is increased higher than that of the first collector layer, the band gap energy is linearly increased from the first collector layer to the collector buffer layer, and the band gap energy of the collector buffer layer is increased larger than that of the first collector layer. Then, in an operation state, a space charge is formed in part of or throughout the first collector layer, throughout the second collector layer, and in part of the collector buffer layer. As a result, the minimum band gap energy can be increased larger than that in the conventional HBT or invented HBT shown in FIG. 2 to FIG. 4, and the ionization rate or the tunnel probability can be reduced, thereby increasing the collector brekdown voltage. This advantageously improves reliability of an integrated circuit and a saturation output of a power HBT.

A description has been made above according to bipolar transistors. The same idea can also be applied to a kind of vertical type field effect transistors (FETs) in which the current channel is depleted Such kind of FETs is called as a "Static Induction Transistor (SIT)" or a "Permiable Base Transistor (PBT)". When p+ thin layer is inserted into the depleted channel on the drain side for such FETs with n-channel, the similar effect stated above is expected.

We claim:
1. A heterojunction bipolar transistor comprising:
an emitter layer of a first conductivity type;
a base layer of a second conductivity type adjacent to said emitter layer;
a collector buffer layer of the first conductivity type; and
a collector layer arranged between said collector buffer layer and said base layer,
wherein said collector layer includes a first collector sub-layer formed at the side of said base layer and a second collector sub-layer arranged at the side of said collector buffer layer,
said first collector sub-layer is a semiconductor layer having an impurity concentration lower than that of said base layer, and
said second collector sub-layer is a semiconductor layer of the second conductivity type having an impurity concentration higher than that of said first collector sub-layer,
wherein said first collector sub-layer and said second collector sub-layer are depleted in an operating state and form an electric field distribution determined by parameters of said base layer, said first collector sub-layer, said second collector sub-layer and said collector buffer layer.

2. A transistor according to claim 1, wherein said collector buffer layer is a collector electrode layer.

3. A transistor according to claim 1, wherein said first collector sub-layer is the first conductivity type and its impurity concentration is designed so that the impurity concentration compensates for a space charge produced by free carriers injected into the collector depletion layer upon transistor operation.

4. A transistor according to claim 1, further comprising a third collector sub-layer between said base layer and said first collector sub-layer,
wherein said third collector sub-layer is the first conductivity type, and
wherein said first, said second and said third collector sub-layers are depleted in an operating state and form an electric field distribution determined by parameters of said base layer, said first, said second, said third collector sub-layers and said collector buffer layer.

5. A heterojunction bipolar transistor comprising:

an emitter layer of a first conductivity type;

a base layer of a second conductivity type adjacent to said emitter layer;

a collector buffer layer of the first conductivity type; and a collector layer arranged between said collector buffer layer and said base layer, wherein said collector layer includes a first collector sub-layer formed at the side of said base layer and a second collector sub-layer arranged at the side of said collector buffer layer, said first collector sub-layer is a semiconductor layer having an impurity concentration lower than that of said collector buffer layer, a band gap energy of which is formed in a predetermined distribution from said base layer to said second collector sub-layer, said second collector sub-layer is a semiconductor layer of the second conductivity type having an impurity concentration higher than that of said first collector sub-layer, a band gap energy which is formed in a predetermined distribution from said first collector sub-layer to said collector buffer layer, and said collector buffer layer has a band gap energy larger than that of said second collector sub-layer, wherein said first collector sub-layer and second collector sub-layer are depleted in an operating state and form an electric field distribution determined by parameters of said base layer, said first collector sub-layer, said second collector sub-layer and said collector buffer layer.

6. A transistor according to claim 5, wherein the band gap energy of said first collector sub-layer is increasing from said base layer to said collector buffer layer.

7. A transistor according to claim 5, wherein distribution of the band gap energy of said first collector sub-layer and distribution of said second collector sub-layer form a pattern which is gradually increased as a whole.

* * * * *